United States Patent
Otsuga et al.

(10) Patent No.: US 7,812,628 B2
(45) Date of Patent: Oct. 12, 2010

(54) METHOD OF ON-CHIP CURRENT MEASUREMENT AND SEMICONDUCTOR IC

(75) Inventors: Kazuo Otsuga, Kokubunji (JP); Tetsuya Yamada, Sagamihara (JP); Kenichi Osada, Tokyo (JP); Yusuke Kanno, Kodaira (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 201 days.

(21) Appl. No.: 11/956,122

(22) Filed: Dec. 13, 2007

(65) Prior Publication Data

US 2008/0143184 A1    Jun. 19, 2008

(30) Foreign Application Priority Data

Dec. 13, 2006  (JP) .............................. 2006-335314
Oct. 31, 2007  (JP) .............................. 2007-282958

(51) Int. Cl.
*G01R 31/26* (2006.01)

(52) U.S. Cl. ..................................... 324/763

(58) Field of Classification Search .............. 324/158.1, 324/763–765
See application file for complete search history.

(56) References Cited

U.S. PATENT DOCUMENTS

| | | | |
|---|---|---|---|
| 6,888,395 B2 * | 5/2005 | Mizuno et al. ............... | 327/333 |
| 6,927,592 B2 * | 8/2005 | Manhaeve et al. ........... | 324/765 |
| 6,949,942 B2 * | 9/2005 | Eldridge et al. ............. | 324/765 |
| 7,282,905 B2 * | 10/2007 | Chen et al. ................ | 324/158.1 |
| 7,339,803 B2 * | 3/2008 | Nojima ........................ | 363/37 |
| 2003/0141926 A1 | 7/2003 | Mizuno et al. | |
| 2006/0038578 A1 | 2/2006 | Hashimoto | |
| 2009/0113186 A1 * | 4/2009 | Kato et al. ................... | 712/222 |
| 2009/0134904 A1 * | 5/2009 | Zjajo et al. .................. | 324/765 |

FOREIGN PATENT DOCUMENTS

| | | |
|---|---|---|
| JP | 62-278473 A | 12/1987 |
| JP | 5-288798 A | 11/1993 |
| JP | 63-93142 A | 4/1998 |
| JP | 2000-206174 A | 7/2000 |
| JP | 2003-218682 A | 7/2003 |
| JP | 2006-174132 A | 6/2006 |

\* cited by examiner

*Primary Examiner*—Ha Tran T Nguyen
*Assistant Examiner*—Joshua Benitez
(74) *Attorney, Agent, or Firm*—Miles & Stockbridge P.C.

(57) ABSTRACT

A semiconductor integrated circuit is constituted to include a circuit block having a predetermined function, a power switch capable of supplying an operating power to the circuit block, and a current measuring circuit for obtaining a current flowing to the circuit block based on a voltage between terminals of the power switch in a state in which the power switch is turned on and an on-resistance of the power switch. The current flowing to the circuit block is obtained based on the voltage between terminals of the power switch in the state in which the power switch is turned on and the on-resistance of the power switch. Thus, it is possible to measure a current of the circuit block in a state in which a chip is normally operated.

11 Claims, 11 Drawing Sheets

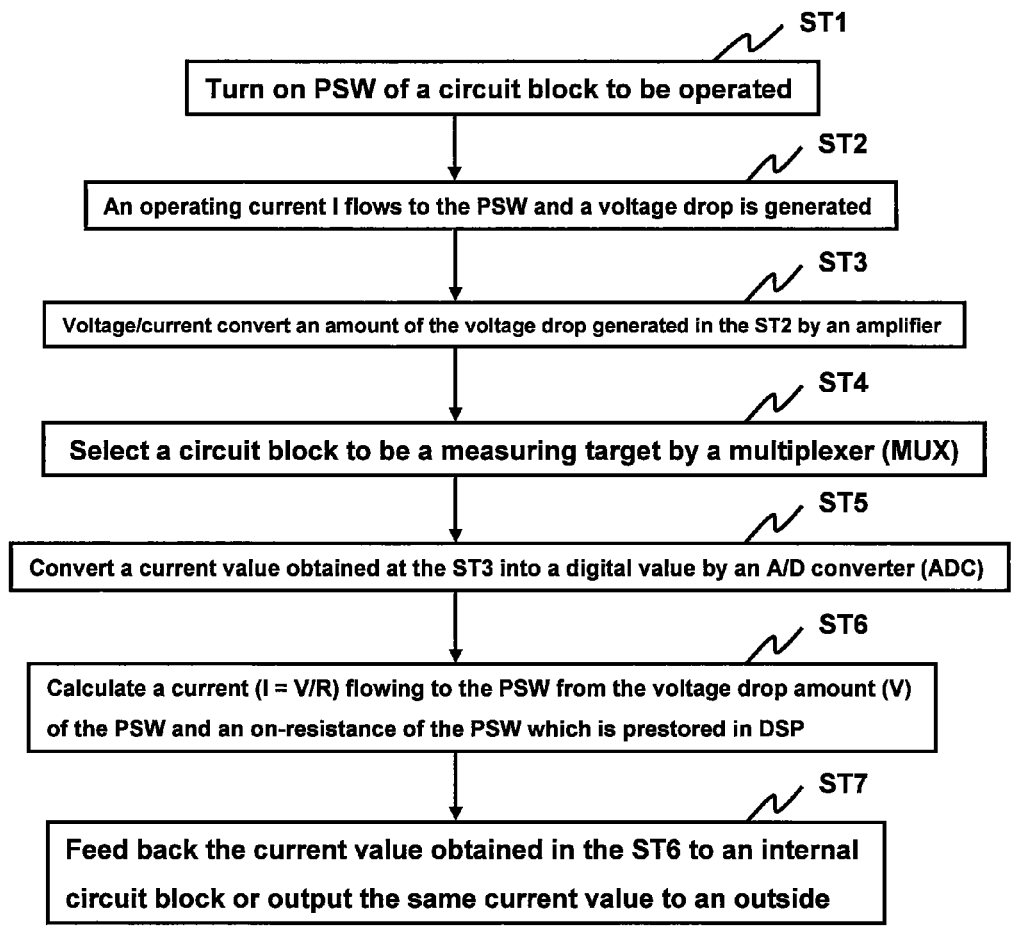
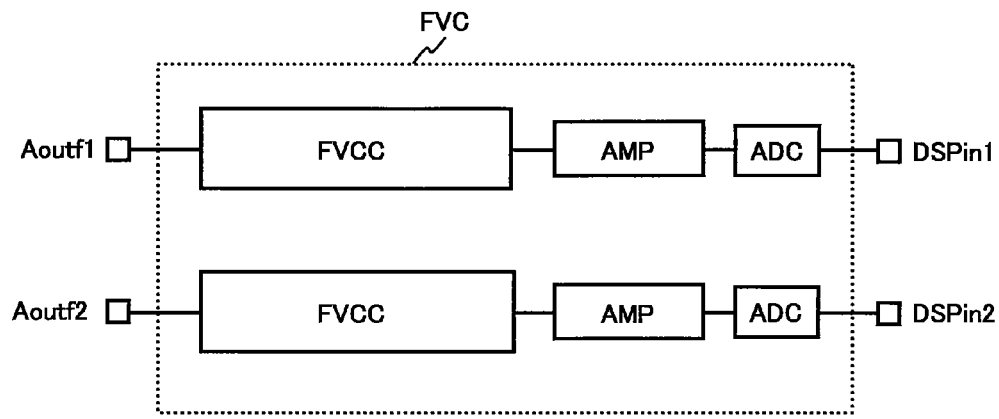

US 7,812,628 B2

METHOD OF ON-CHIP CURRENT MEASUREMENT AND SEMICONDUCTOR IC

CLAIM OF PRIORITY

The present application claims priority from Japanese application JP 2006-335314 filed on Dec. 13, 2006 and JP 2007-282958 filed on Oct. 31, 2007, the content of which is hereby incorporated by reference into this application.

FIELD OF THE INVENTION

The present invention relates to a technique for measuring a current of a circuit block in an operation of a semiconductor chip (which will be hereinafter referred to as a "chip").

BACKGROUND OF THE INVENTION

In recent years, a microfabrication of a fabrication process rule has increasingly been developed by an enhancement in a semiconductor process technique. As a result, the number of transistors to be loaded onto one chip is increased and an SoC (System On a Chip) having a main function of a computer embedded in one chip has been used generally. Referring to the SoC, function blocks (circuit blocks) such as a microprocessor, an interface controller, a multimedia signal processing processor and a memory have been integrated into one chip, a necessary area for mounting is reduced, and a cost is also cut down more remarkably as compared with a system comprising a plurality of chips having an equivalent function. On the other hand, in the SoC in which a high integration progresses, there is a problem in that a consumed current is increased with an increase in the number of the transistors. The increase in the consumed current increases an amount of heat generation of the chip and deteriorates a reliability of the chip. In a portable apparatus, moreover, a battery driving time is reduced. An increase in the number of the transistors to be integrated into a chip and an increase in a leakage current of the transistor with a microfabrication mainly cause the increase in the consumed current. The type of the consumed current can be divided into two types including a DC current and an AC current. The DC current is a so-called leakage current which flows if a source voltage is supplied also in a state in which a circuit is not operated. On the other hand, the AC current is a charging/discharging current of the transistor and is a current (an active current) consumed when the circuit is operated. Conventionally, an attention has been paid to how to reduce the leakage current in order to reduce the consumed current. A method of reducing the leakage current in the SoC will be described below as an example.

The SoC is an aggregate of circuit blocks divided every function. In respect of an operating state of the SoC in a certain moment, all of the circuits are not operated. The reason is that the operation of only any of the circuit blocks to satisfy demanded functions is sufficient. By blocking the supply of a power to the circuit which is not used, therefore, it is possible to eliminate a leakage current of the circuit block. The method has been described in Patent Document 1, for example.

In order to carry out an analysis, a test or a feedback to a control, moreover, a technique for measuring an amount of a current in any of the circuit blocks is also required. They have been described in Patent Documents 2 and 3. The Patent Document 2 has described a method of providing switching means between a power wire and each of circuits or between a ground wire and the circuit, bringing the switch means into a blocking state and connecting a measuring apparatus between pads provided on both ends of the switching means, thereby measuring a consumed current in case of measuring the consumed current of each circuit. The Patent Document 3 has described that there are included switching means provided in each sub circuit and serving to block a current of the sub circuit, detecting means for detecting a power current of the sub circuit, and testing means for controlling the switching means in response to an output of the detecting means.

Recently, the function required for the SoC has been expanded and the number of the transistor operated in a certain moment has been increased. As a result, a current in the operation has also been increased so as not to be disregarded. In particular, there is given a demand for reducing a consumed current as greatly as possible in a portable apparatus. In the same manner as the leakage current, therefore, it is important to reduce the active current. Moreover, a method of measuring an amount of the active current consumed in any circuit block has also been important in the same manner.

[Patent Document 1] JP-A-2003-218682 Publication
[Patent Document 2] JP-A-63-93142 Publication
[Patent Document 3] JP-A-5-288798 Publication

SUMMARY OF THE INVENTION

In the measurement of the active current in the past, a current flowing to a power supply pin of a chip was measured by external measuring devices in many cases. Although an active current in the whole chip can be measured in the method, however, it is impossible to measure a current of a circuit block (which is referred to as "an on-chip current") in an operation (a normal operation) other than a test mode of the chip. This respect cannot be solved in the Patent Documents 1 to 3.

It is an object of the invention to provide a technique for measuring a current of a circuit block in a state in which a chip carries out a normal operation.

The above and other objects and novel features of the invention will be apparent from the description of the specification and the accompanying drawings.

Typical inventions disclosed in the application will be briefly described below.

More specifically, in the case in which there are provided a circuit block having a predetermined function and a power switch capable of supplying an operating power to the circuit block, a voltage between terminals of the power switch in a state in which the power switch is turned on is obtained, and a current flowing to the circuit block is calculated based on the voltage between terminals of the power switch and an on-resistance of the power switch.

BRIEF DESCRIPTION OF THE DRAWINGS

FIG. 6 is a flowchart showing a procedure for measuring a current in the SoC, FIG. 11 is a circuit diagram showing an example of a structure of a frequency and voltage converting circuit in FIG. 9.

DETAILED DESCRIPTION OF THE PREFERRED EMBODIMENTS

1. Summary of the Preferred Embodiments

Figure 1:
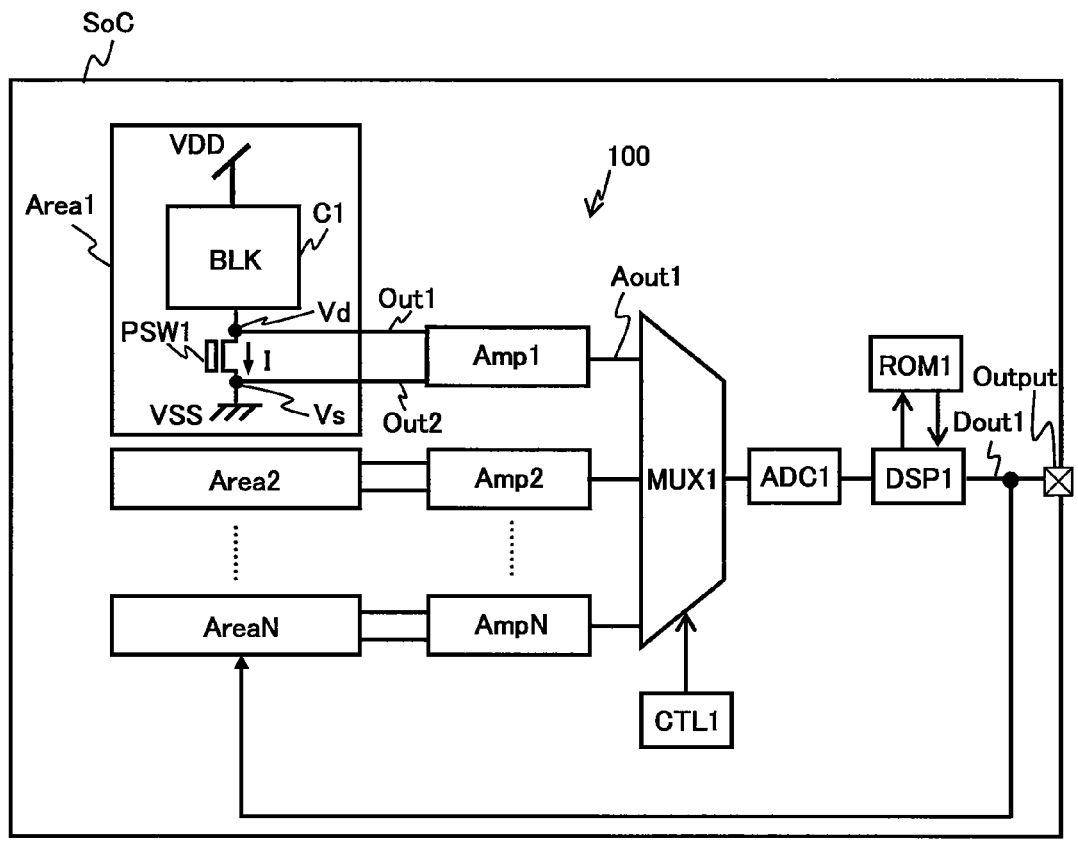
FIG. 1 is a block diagram showing an example of a structure of an internal logic circuit in an SoC according to an example of a semiconductor integrated circuit in accordance with the invention.

First of all, description will be given to the summary of the preferred embodiments according to the invention disclosed in the application. In the description of the summary of the preferred embodiments, the reference numerals of the drawings in parentheses only illustrate elements included in the concept of components having them.

[1] A method of on-chip current measurement according to the preferred embodiments of the invention comprises a first processing of obtaining a voltage between terminals of a power switch (PSW1) capable of supplying an operating power to a circuit block (C1) having a predetermined function in a state in which the power switch is turned on and a second processing of calculating a current flowing to the circuit block based on the voltage between terminals of the power switch and an on-resistance of the power switch in a semiconductor integrated circuit (SoC) including the circuit block and the power switch.

According to the structure, the voltage between terminals of the power switch in the state in which the power switch is turned on is obtained, and the current flowing to the circuit block is calculated based on the voltage between terminals of the power switch and the on-resistance of the power switch. Consequently, it is possible to measure the current of the circuit block in a state in which a chip is normally operated.

[2] At this time, the result of the calculation of the current which is obtained in the second processing is output to an outside through an external terminal of the semiconductor integrated circuit. Consequently, it is possible to externally monitor the result of the calculation of the current.

[3] According to another aspect, a semiconductor integrated circuit is constituted to comprise a circuit block (C1) having a predetermined function, a power switch (PSW1) capable of supplying an operating power to the circuit block, and a current measuring circuit (100) for obtaining a current flowing to the circuit block based on a voltage between terminals of the power switch in a state in which the power switch is turned on and an on-resistance of the power switch.

According to the semiconductor integrated circuit having the structure, the current measuring circuit obtains the current flowing to the circuit block based on the voltage between terminals of the power switch in the state in which the power switch is turned on and the on-resistance of the power switch. Consequently, it is possible to measure the current of the circuit block in the state in which the chip is normally operated.

[4] At this time, the current measuring circuit can be constituted to include an amplifier (Amp1) for converting the voltage between terminals of the power switch in the state in which the power switch is turned on into a current corresponding thereto, an AD converter (ADC1) for converting a signal output from the amplifier into a digital signal, and a calculating circuit (DSP1) capable of calculating the current flowing to the circuit block based on the converted output of the AD converter.

[5] When the circuit block and the power switch corresponding thereto are provided in plural sets, a plurality of amplifiers is disposed corresponding to the power switches.

[6] In the case in which a plurality of amplifiers is disposed corresponding to the power switches, the power measuring circuit can be constituted to include a multiplexer (MUX1) capable of selectively outputting signals of the amplifiers to the AD converter. By the structure, the AD converter and the calculating circuit can be shared by the amplifiers.

[7] Moreover, the AD converter and the calculating circuit can be shared by the amplifiers. Therefore, the current measuring circuit can be constituted to include a controller (CTL2) capable of selectively outputting the output signals of the amplifiers to the AD converter by controlling the amplifiers.

[8] The current measuring circuit can be constituted to include a voltage and frequency converting circuit (VFC1) for converting the voltage between terminals of the power switch in the state in which the power switch is turned on into an oscillating frequency corresponding thereto, a frequency and voltage converting circuit (FVC) for converting a signal output from the voltage and frequency converting circuit into a voltage corresponding thereto, and a calculating circuit (DSP2) capable of calculating a current flowing to the circuit block based on the converted output of the frequency and voltage converting circuit.

[9] When the circuit block and the power switch corresponding thereto are provided in plural sets, a plurality of voltage and frequency converting circuits can be disposed corresponding to the power switches.

[10] According to a further aspect, a semiconductor integrated circuit is constituted to comprise a circuit block (C1) having a predetermined function, a regulator (Reg1) including a transistor (MP3) for dropping a source voltage and serving to control an on-resistance of the transistor based on a reference voltage, thereby forming an operating voltage of the circuit block, and a current measuring circuit (100) for obtaining a current flowing to the circuit block based on a voltage between a drain and a source of the transistor in a state in which the operating voltage is supplied to the circuit block through the transistor.

According to the semiconductor integrated circuit having the structure, the current measuring circuit obtains the current flowing to the circuit block based on the voltage between a drain and a source of the transistor in the state in which the operating voltage is supplied to the circuit block through the transistor. Consequently, it is possible to measure the current of the circuit block in a state in which a chip is normally operated.

[11] The current measuring circuit can be constituted to include an amplifier (Ampn1) for converting the voltage between a drain and a source of the transistor in the state in which the operating voltage is supplied to the circuit block through the transistor into a current corresponding thereto, an AD converter (ADC1) for converting a signal output from the amplifier into a digital signal, and a calculating circuit (100) capable of calculating the current flowing to the circuit block based on the converted output of the AD converter.

[12] When the circuit block and the regulator corresponding thereto are provided in plural sets, a plurality of amplifiers can be disposed corresponding to the regulators.

2. Further Detailed Description of the Preferred Embodiments

Next, the embodiment will be described in more detail. The best mode for carrying out the invention will be described below in detail with reference to the drawings. In all of the drawings for explaining the best mode for carrying out the invention, members having the same functions have the same reference numerals and repetitive description thereof will be omitted.

Figure 15:
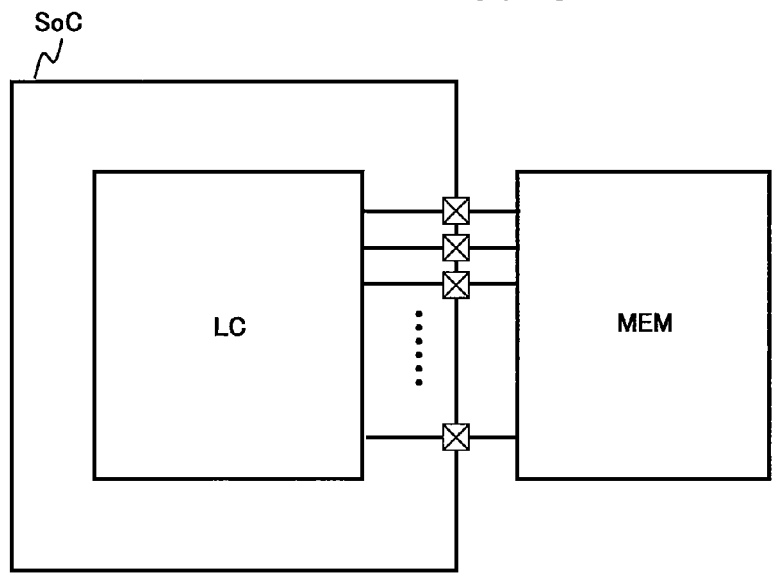
FIG. 15 is a block diagram showing an example of a structure of a user system including the SoC according to an example of the semiconductor integrated circuit in accordance with the invention.

FIG. 15 shows an SoC (System On a Chip) according to an example of a semiconductor integrated circuit in accordance with the invention. The SoC shown in FIG. 1 is not particularly restricted but is formed on a semiconductor substrate such as a single crystal silicon substrate by a well-known technique for manufacturing a semiconductor integrated circuit. The SoC is connected to an external memory MEM in a user system and access can be given to the external memory MEM through an internal logic circuit LC of the SoC.

FIG. 1 shows an example of a structure of the internal logic circuit LC.

The internal logic circuit LC includes a plurality of power domains Area1, Area2, . . . , AreaN, and a power measuring circuit 100 for measuring a current flowing to a circuit block C1 included in each of the power domains Area1, Area2, . . . , AreaN. The circuit block C1 included in each of the power domains Area1, Area2, . . . , AreaN is not particularly restricted but is set to be a function module having a predetermined function, for example, a CPU (central processing unit), a baseband processor, an application processor, a memory or an interruption processing controller.

A high potential side power (VDD) and a ground power VSS which is different from a power in each of the other power domains are supplied to the power domains Area1, Area2, . . . , AreaN independently of each other. In the power domains, moreover, power switches (PSW1 in the Area1) provided in the respective power domains are controlled individually so that a power supply for each circuit block C1 can be blocked. The power switch is not particularly restricted but is set to be an n-channel type MOS transistor. The current measuring circuit 100 includes amplifiers Amp1 to AmpN, a multiplexer MUX1, an MUX controller CTL1, an AD (analog/digital) converter ADC1, a digital signal processor DSP1 and a read only memory ROM1. In general, the amplifiers Amp1 to AmpN and the ADC1 are set to be analog circuits. The amplifiers Amp1 to AmpN have the function of converting a terminal voltage generated by a flow of a current I between a drain and a source into a current corresponding thereto in the case in which the power switches PSW1 in the corresponding power regions Area1, Area2, . . . , AreaN are turned on. The multiplexer MUX1 selectively connects output terminals of the amplifiers Amp1 to AmpN to the AD converter ADC1 in a subsequent stage. The operation is controlled by the MUX controller CTL1. A signal output from the AD converter ADC is transmitted to the digital signal processor DSP1 in a subsequent stage. The digital signal processor DSP1 calculates a current flowing to the power switch PSW1 in each of the power domains Area1, Area2, . . . , AreaN, that is, a current flowing to the circuit block C1 corresponding thereto based on the signal output from the AD converter ADC1. The ROM1 stores information about an on-resistance R of the power switch which is well known in a design and an amplification coefficient α of an amplifier which is well known in the design. In the calculation of the current, the information stored in the ROM1 is referred to if necessary. The ROM1 may be constituted by a read only memory such as a mask ROM or a nonvolatile memory such as a flash memory. A signal Dout1 output from the digital signal processor DSP1 can be output to an outside through an external terminal Output of the SoC. Moreover, the signal Dout1 output from the digital signal processor DSP1 can be transmitted to the power domains Area1, Area2, . . . , AreaN if necessary and can be utilized for a feedback control. For example, if the power domain AreaN is the interruption processing controller, it can carry out a control for giving a notice to the CPU loaded onto another power domain to regulate a power supply voltage, an operating frequency or the number of processing tasks in a whole chip, thereby reducing a current value to be equal to or smaller than a standard when a current having a value which is equal to or greater than the standard flows.

In the example, it is possible to measure the current flowing to each circuit block C1 in the following manner also in the middle of the normal operation of the chip.

The current flowing to the circuit block C1 is once aggregated in the power switch PSW1. By measuring the current I flowing to the power switch, therefore, it is possible to obtain the current flowing to the circuit block C1. Although a power switch has been used for measuring the current flowing to the circuit block also in the conventional art, it has been caused to function to select a circuit block to be measured to the utmost. For this reason, only the power switch of the circuit block to be measured is turned on or off and only the circuit block is thus operated. In other words, it is impossible to measure the currents of the individual circuit blocks when the chip is set in a normal operating state (in general, a plurality of circuit blocks is operated in the normal operation). According to the example, however, it is possible to measure the currents of the individual circuit blocks C1 while supplying a power to a part of the power domains to cause the chip to carry out the normal operation.

A procedure for measuring a current according to the example will be described with reference to a flowchart of FIG. 6.

First of all, the power switch PSW1 corresponding to the circuit block C1 to be a measuring object is turned on (ST1). Consequently, the operating current I flows to the power switch PSW1 and a voltage drop is generated by the on-resistance of the power switch PSW1 (ST2). By the voltage drop, a voltage between a node (Vd) on a circuit block side in the power switch PSW1 and a node (Vs) on a ground potential side is transmitted to the corresponding amplifier Amp1. In the amplifier Amp1, a voltage and current conversion is carried out (ST3). Then, a signal output from the amplifier Amp1 is selectively transmitted to the AD converter ADC1 through the multiplexer MUX1 (ST4) and is converted into a digital signal (ST5), and the digital signal is subsequently transmitted to the digital signal processor DSP1. In the digital signal processor DSP1, a current flowing to the power switch PSW1, that is, a current flowing to the circuit block C1 is calculated based on a terminal voltage of the power switch PSW1 and the on-resistance of the power switch PSW1 (ST6). Information about the on-resistance of the power switch PSW1 is prestored in the ROM1 and is referred to by the digital signal processor DSP1. The current flowing to the circuit block C1 can be obtained by dividing the voltage between the node (Vd) on the circuit block side and the node (Vs) on the ground potential side in the power switch by the on-resistance of the power switch (PSW1) which is well known in a design. In the measurement of the current, the power switches in all of the power domains may be maintained to be on. Therefore, it is possible to measure the current of each of the circuit blocks in the normal operation of the chip. A result of the calculation in the digital signal processor DSP1 is fed back to an internal circuit or is externally output through the external terminal Output (ST7).

It is anticipated that a voltage between Vd and Vs in an actual chip is approximately 10 mV, that is, a signal strength is small because the power switch PSW1 has a low on-resistance. For this reason, there is a possibility that a noise might be mixed if the signal is led around in the chip in this state. Therefore, it is preferable to reduce lengths of signal transmission paths to the power switches and the amplifiers Amp1 to AmpN corresponding thereto as greatly as possible by disposing the amplifiers Amp1 to AmpN in the vicinity of the corresponding circuit blocks. Even if the noise is mixed more or less, thus, it is possible to measure a current with high precision.

Figure 2:
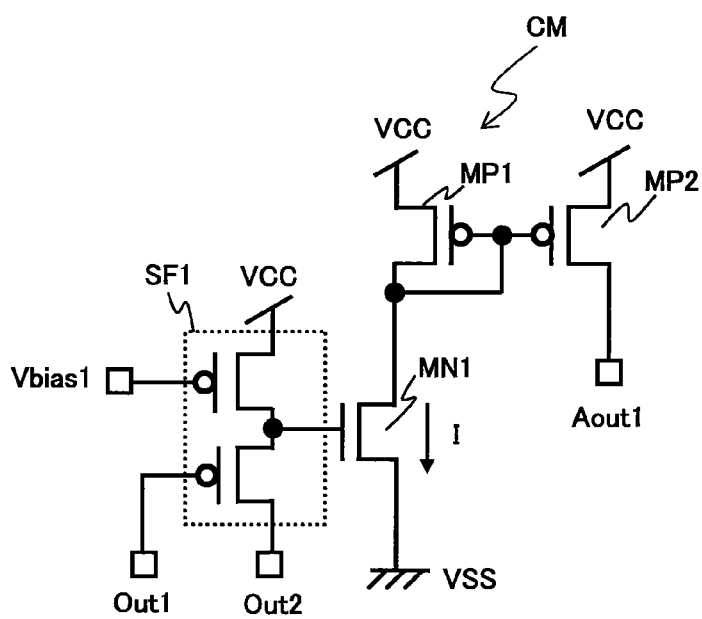
FIG. 2 is a circuit diagram showing an example of a structure of an amplifier in the internal logic circuit illustrated in FIG. 1.

FIG. 2 shows an example of structures of the amplifiers Amp1 to AmpN.

The amplifier is roughly constituted by a source follower circuit SF1 for converting a voltage input through Out1 and a current mirror circuit CM formed by p-channel type MOS transistors MP1 and MP2 for converting the voltage into a current signal. An amplification factor α of the circuit can be almost expressed in a device scale ratio of the p-channel type MOS transistors MP1 and MP2. Vbias1 is a bias signal for operating SF1. MN1 is an N-channel type MOS transistor for converting an output voltage signal of the SF1 into a current signal. Since the amplifier is an analog circuit, VCC (approximately 3 V) to be a higher voltage than VDD of a digital circuit is applied as a source voltage.

Figure 3:
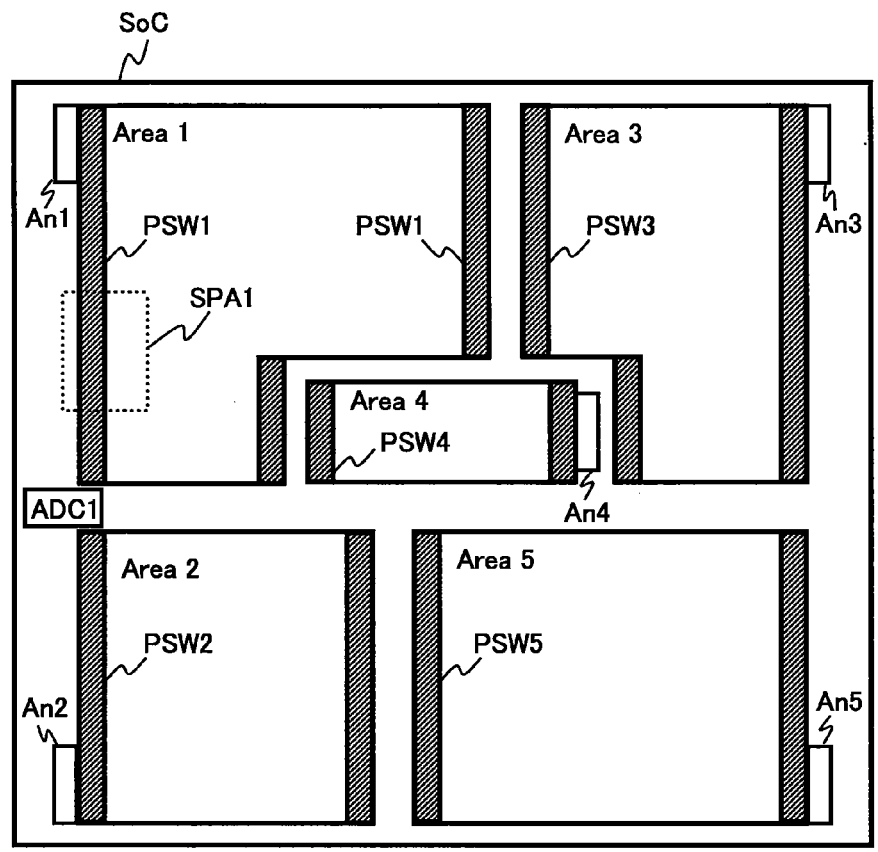
FIG. 3 is a diagram for explaining a layout of a main part in the SoC.

FIG. 3 shows a layout of the main part in the SoC.

The power domain is constituted by five areas of Area1 to Area5. Basically, the power switches (PSW1 to PSW5) are present on both sides of the respective circuit blocks. Each of the power domains is formed by a so-called digital circuit and the amplifiers Amp1 to AmpN (analog circuits) are disposed in the vicinity of the analog circuits (An1 to An5). Thus, it is possible to shorten a distance at which a feeble signal is led around in the chip, thereby carrying out a measurement with high precision. Since the AD converter ADC1 can be shared by the chip, it is disposed in a certain portion of the chip. The DSP1 can be provided in any of the power domains Area1 to Area5.

Figure 4:
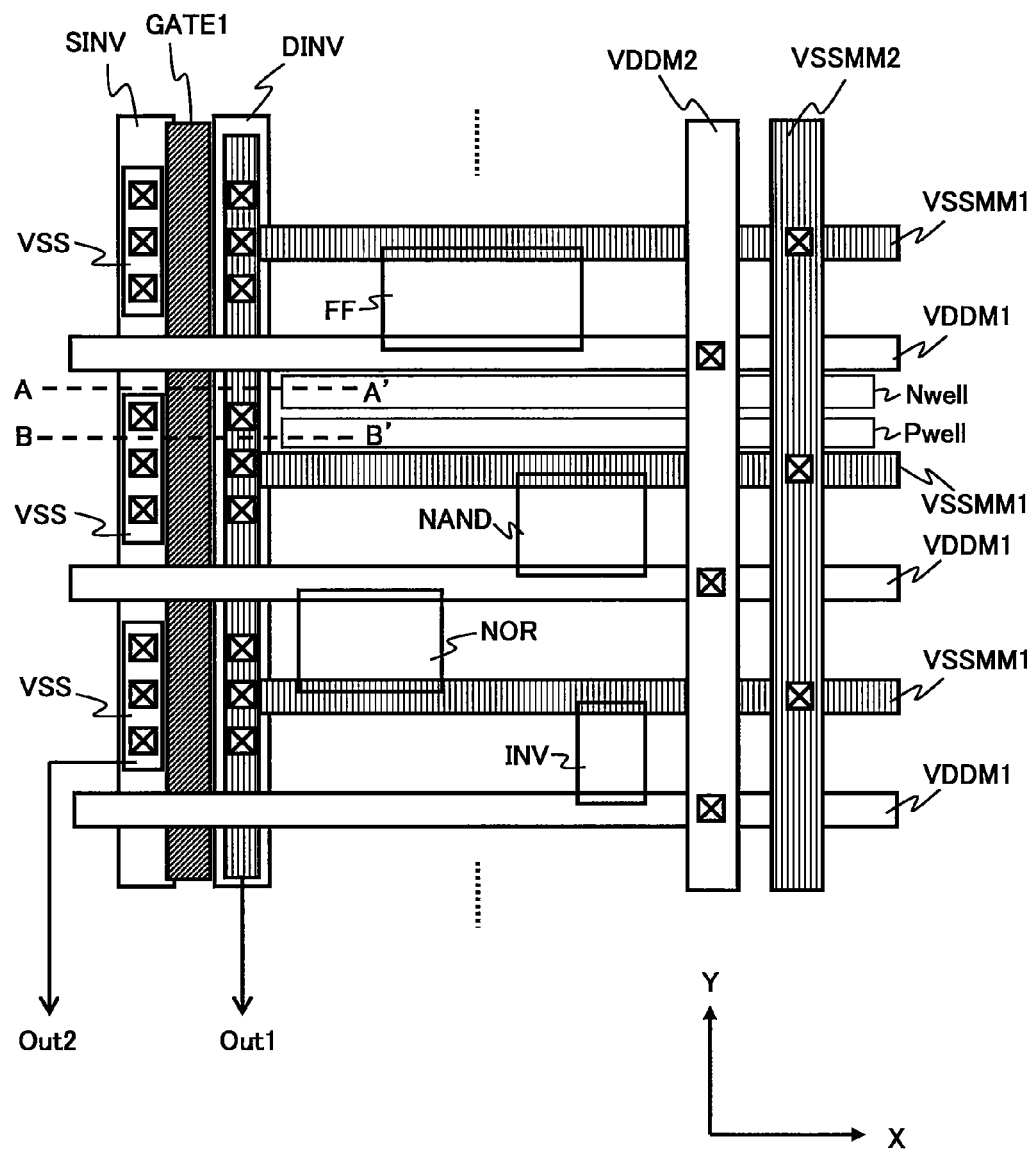
FIG. 4 is a diagram for explaining a layout of a periphery of a power switch in the SoC.

FIG. 4 shows a layout of the periphery of the power switch.

In FIG. 4, a wiring extended in an x direction is interconnected through a first metal layer M1, and a VDD power wire VDDM1 is interconnected to a virtual ground (VSSM) power wire VSSMM1. VSSM denotes a power wire which can be cut off from a true ground (VSS) by a power switch which will be described below. A wiring extended in a y direction is interconnected through a second metal layer M2 which is separate from the first metal layer interconnected in the x direction, for example. The VDD and the VSSM are globally interconnected in the power domains. Therefore, regular longitudinal trunks (VDDM2, VSSMM2) are connected to reduce a resistance. In FIG. 4, the number of each of them is one. However, they are disposed regularly and optimally in order to set a voltage drop to have a specified value or less in the supply of a necessary amount of current for an operating speed of an internal logic circuit. A basic circuit layout including an inverter circuit (INV), a negative AND circuit (NAND), a negative OR circuit (NOR) and a flip-flop circuit (FF) which are referred to as standard cells is wholly provided in the power domain. The power switch PSW is formed by a drain side diffused layer DINV, a gate GATE1 and a source side diffused layer SINV. Moreover, the PSW is usually formed by NMOS. The DINV is connected to the VSSMM1 through a contact and the SINV is connected to a new ground VSS through a contact. The VSSM and the VSS correspond to the Vd node and the Vs node in FIG. 1. Since the VSS and the VSSM are usually connected to the regular longitudinal trunks, an impedance is reduced. Therefore, it is sufficient that each of the Vd and the Vs has a probe point in each of the VSS and the VSSM. On the other hand, the provision of a plurality of probe points has an advantage that a slight voltage error made in the power domain can be absorbed.

In general, a gate oxide film of the power switch is formed more thickly than the standard cell in the power domain. When the power switch is turned off, GATE1 is set into a low level (0 V). When the power switch is turned on, the GATE1 is set into a high level (approximately 1.5 V). Thus, a connecting relationship between the virtual ground VSSM and the new ground VSS is controlled.

Figure 5:
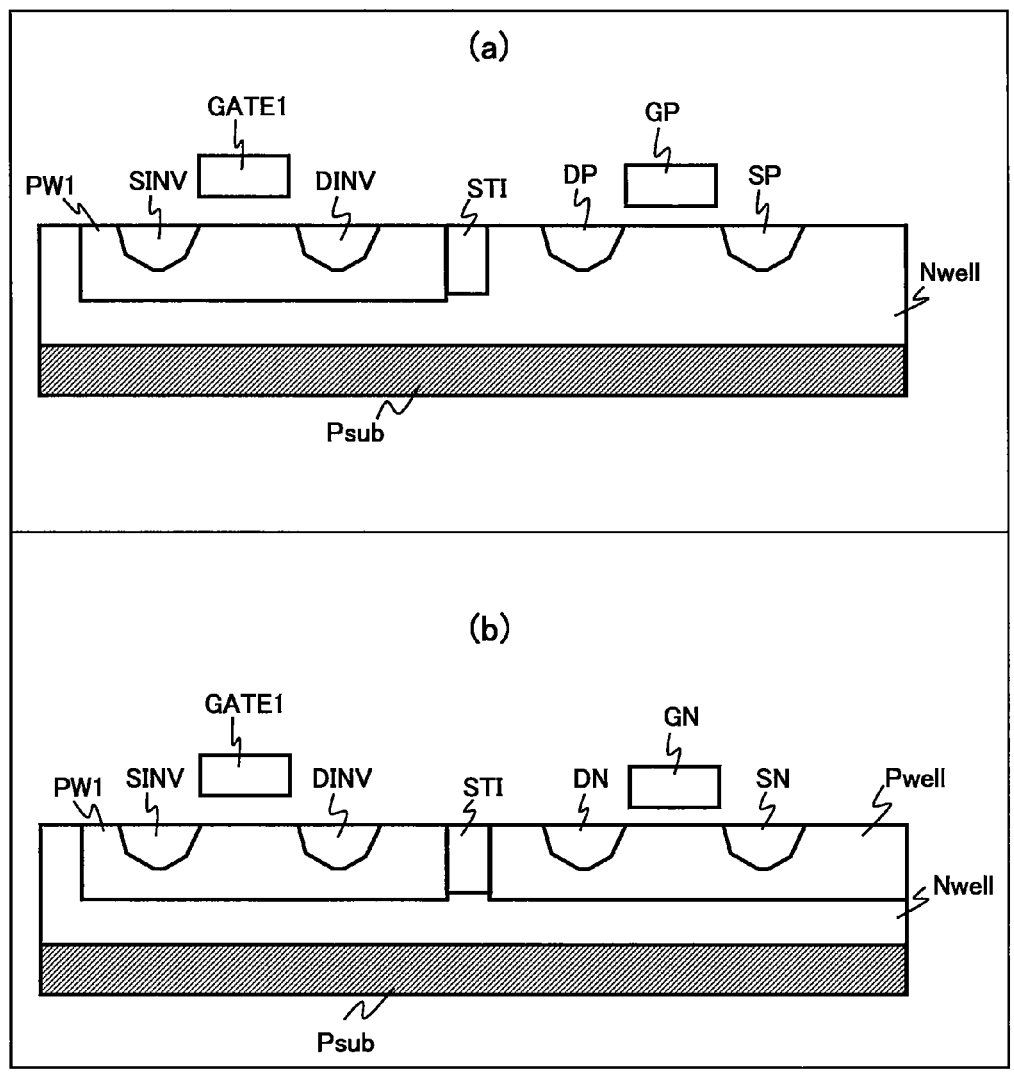
FIG. 5 is a sectional view showing a main part in FIG. 4.

FIG. 5 shows sections taken along A-A' and B-B' in FIG. 4.

FIG. 5(a) shows the section taken along A-A'. There is formed a triple well structure including an N-type well (Nwell) provided on a P-type substrate (Psub) and a P-type well (PW1, Pwell) provided on the Nwell. The power switch is an N-channel type MOS transistor formed on the PW1. PMOS corresponding to a part of a standard cell in a power domain is formed through a device isolating region (STI). GP, DP and SP correspond to a gate, a drain and a source, respectively.

FIG. 5(b) shows the section taken along B-B' in FIG. 4. The triple well is formed in the same manner as described above and a power switch also has the same structure. NMOS corresponding to a part of a standard cell is formed through the STI. GN, DN and SN correspond to a gate, a drain and a source, respectively.

According to the example, the following functions and advantages can be obtained.

(1) In an SoC to be an aggregate of circuit blocks divided every function, it is possible to evaluate, measure and analyze a current value consumed by each of the circuit blocks in a normal operating state of a chip. By enabling a feedback to a chip control based on the measured current value, moreover, it is possible to enhance a reliability of the chip.

(2) It is anticipated that a voltage between Vd and Vs in an actual chip is approximately 10 mV, that is, a signal strength is small because the on-resistance of the power switch PSW1 is low. By disposing the amplifiers Amp1 to AmpN in the vicinity of the corresponding circuit blocks to reduce lengths of signal transmission paths from the power switches to the amplifiers Amp1 to AmpN corresponding thereto as greatly as possible, however, it is possible to measure a current with high precision even if a noise is mixed more or less.

(3) In the case in which a current which is equal to or larger than a standard flows continuously to the circuit block, an amount of heat generated in the chip is increased and the reliability of the chip is reduced. Therefore, a measurement of the current in the circuit block in a normal operation as described above is useful for enhancing the reliability of the chip. Moreover, it is possible to measure the current in each of the circuit blocks in the normal operation. Consequently, it is easy to evaluate and analyze the chip.

Figure 7:
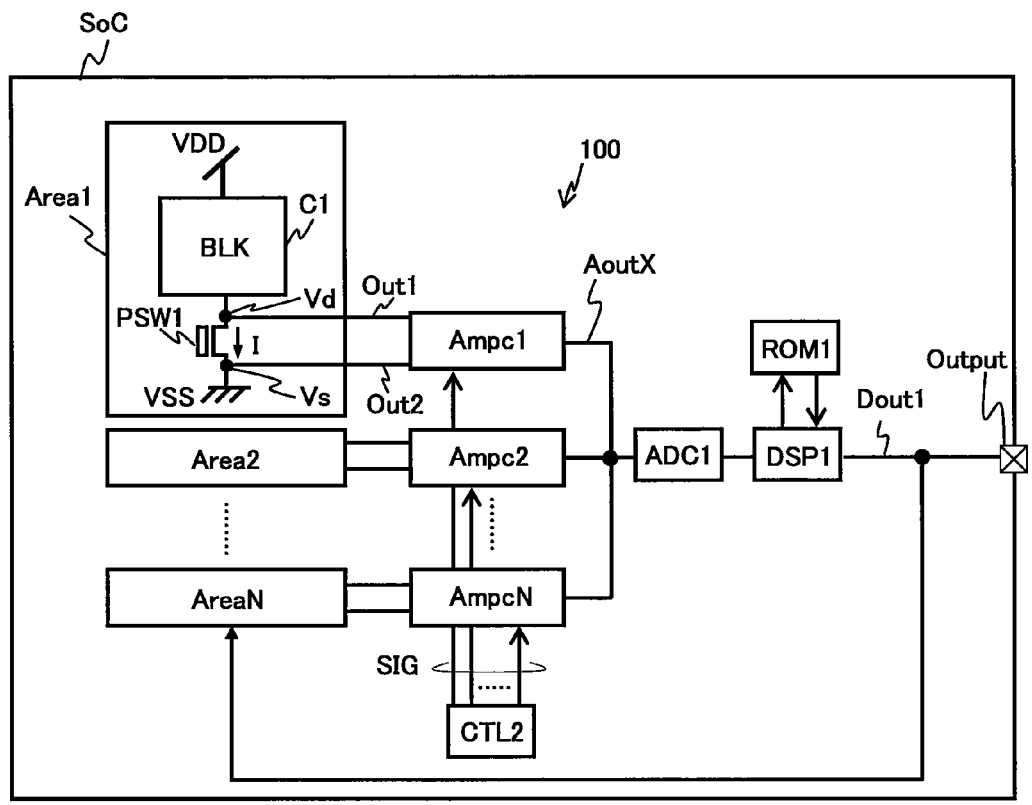
FIG. 7 is a block diagram showing another example of a structure of the main part in the SoC.

FIG. 7 shows another example of the structure of the main part in the SoC.

The structure shown in FIG. 7 is greatly different from that in FIG. 1 in that the multiplexer MUX is omitted and amplifiers Ampc1 to AmpcN are directly controlled by a controller CTL2 through a control line SIG to omit the multiplexer MUX. For example, in the case in which the Ampc1 is to be operated, it is preferable to set only the control line SIG input to the Ampc1 into a high level and to set the other control lines SIG into a low level.

Figure 8:
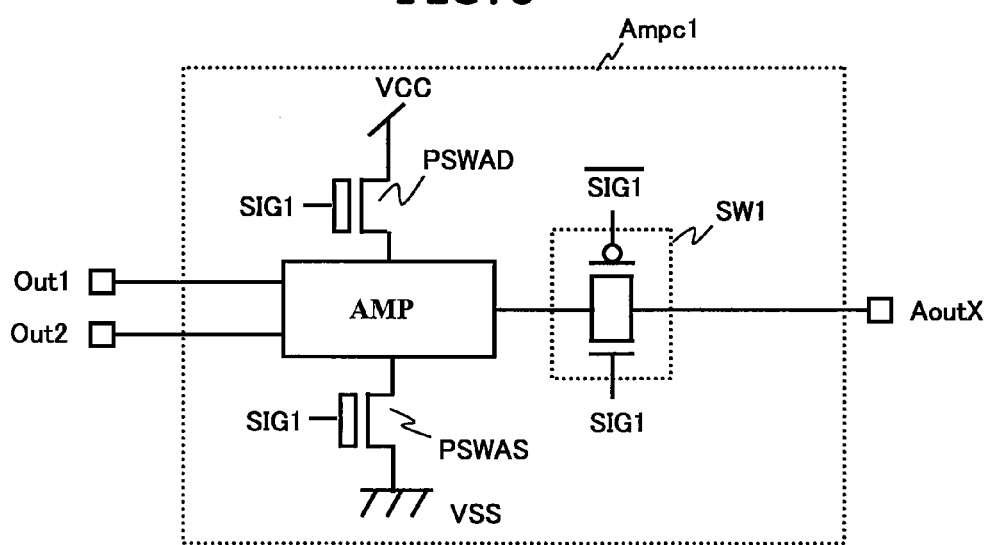
FIG. 8 is a circuit diagram showing an example of a structure of an amplifier in FIG. 7.

FIG. 8 shows an example of a structure of the amplifier Ampc1 in FIG. 7. The other amplifiers also have the same structure.

Out1 and Out2 of Vd and Vs voltage signals output from a power domain Area1 are input to the amplifier in the same manner as shown in FIG. 2. Moreover, a structure of an amplifier body AMP is the same as that shown in FIG. 2. In the structure shown in FIG. 7, a power supply VCC of the amplifier and a power switch (PSWAD, PSWAS) between grounds are newly provided or a switch (SW1) of the amplifier is provided. For example, when the Area1 is selected, the signal wire SIG1 is set into the high level, the n-channel type MOS transistors PSWAD and PSWAS are turned on and a power is supplied to the amplifier AMP. At this time, the switch SW1 is turned on and a signal output from the amplifier AMP is sent from an output terminal AoutX. On the other hand, when the signal wire SIG1 is set into the low level, the n-channel type MOS transistors PSWAD and PSWAS are cut off so that the power is not supplied to the amplifier AMP. Moreover, the switch SW1 is also turned off so that an undefined signal can be prevented from being output to the AoutX.

By the structure, only the amplifier AMP connected to the power domain to be measured can be brought into an operating state and a current consumed in the other amplifiers can be controlled. Therefore, it is possible to reduce a power consumed in the SoC.

Figure 9:
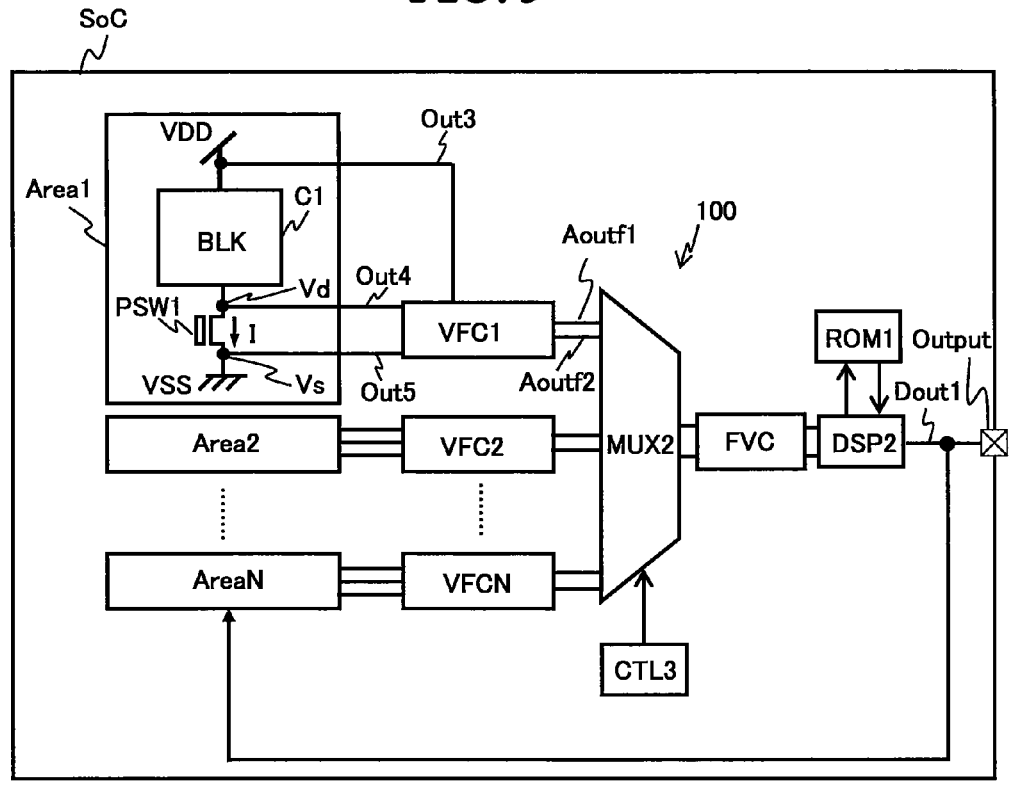
FIG. 9 is a block diagram showing a further example of the structure of the main part in the SoC.

FIG. 9 shows a further example of the structure of the main part in the SoC.

The structure shown in FIG. 9 is greatly different from that shown in FIG. 1 in that voltage and frequency converting circuits VFC1, VFC2, . . . , VFCN are provided in place of the amplifiers shown in FIG. 1 and the analog circuit regions which are required for the respective power domains are decreased. Signals Aoutf1 and Aoutf2 are output from each of the voltage and frequency converting circuits VFC1, VFC2, . . . , VFCN and are selectively supplied to a frequency and voltage converting circuit FVC through a multiplexer MUX2 in a subsequent stage. An operation of the multiplexer MUX2 is controlled by a controller CTL3. The voltage and frequency converting circuits VFC1, VFC2, . . . , VFCN carry out an oscillation at frequencies corresponding to input voltages, respectively. The frequency and voltage converting circuit FVC converts the frequency of the input signal into a voltage corresponding to the same frequency. The output voltage of the frequency and voltage converting circuit FVC is supplied to DSP2 in a subsequent stage.

In the case in which the voltage and frequency converting circuit VFC is used, a signal input from each of the power domains has three systems. More specifically, there are included a voltage level signal Out3 sent from a high potential side power supply VDD, and signals Out4 and Out5 output from both terminals of a power switch PSW1. The reason why the voltage level signal Out3 is necessary is that the voltage and frequency converting circuit is not operated at a low voltage, for example, a voltage between Vd and Vs. A method of processing the three-system signals will be described below.

Figure 10:
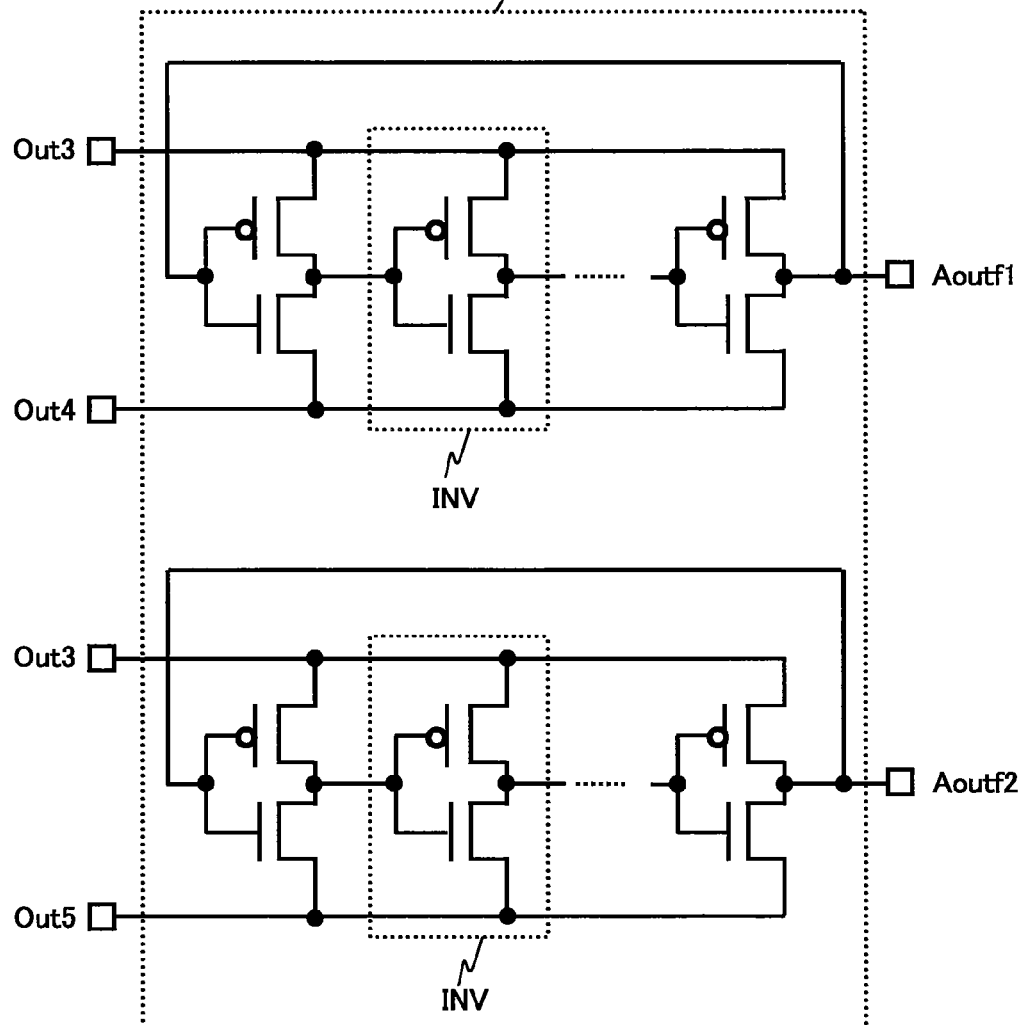
FIG. 10 is a circuit diagram showing an example of a structure of a voltage and frequency converting circuit in FIG. 9.

FIG. 10 shows an example of a structure of the voltage and frequency converting circuit VFC1. The voltage and frequency converting circuits in the other power domains also have the same structure.

The voltage and frequency converting circuit VFC1 has two ring oscillators in which odd-numbered inverters INVs are connected. It has been known that the ring oscillator is oscillated at a frequency which is almost proportional to a difference between a source voltage which is supplied (a source potential of a p-channel type MOS transistor) and a ground voltage (a source potential of an n-channel type MOS transistor). The high potential side power VDD and the node Vd voltage, and the high potential side power VDD and the node Vs voltage are input and respective differential voltages are converted into frequencies to be output. Finally, a difference between the Vd–Vs voltages is calculated from a difference between the frequencies to obtain a current flowing to the power switch PSW1.

An input of the ring oscillator in an upper stage in FIG. 10 is indicated as Out3 (VDD) and Out4 (Vd), and an input of the ring oscillator in a lower stage in FIG. 10 is indicated as Out3 (VDD) and Out5 (Vs). Waveforms to be oscillated at frequencies which are almost proportional to the respective voltage differences are output to the outputs Aoutf1 to Aoutf2. A signal output from the voltage and frequency converting circuit VFC1 is an oscillating signal of the ring oscillator. Even if a noise is mixed more or less, therefore, the frequency is less influenced. Therefore, it is possible to measure a current with high precision. The outputs Aoutf1 to Aoutf2 are input to the frequency and voltage converting circuit FVC through the multiplexer MUX2.

FIG. 11 shows an example of a structure of the frequency and voltage converting circuit FVC.

In the frequency and voltage converting circuit FVC, the input signals Aoutf1 and Aoutf2 are converted into voltages depending on the frequencies through internal frequency and voltage converting circuits FVCCs. Moreover, the voltages are converted into currents in amplifiers AMPs in a subsequent stage and are then converted into digital signals through AD converters ADCs in a subsequent stage. In other words, a signal output to DSPin1 is voltage information between VDD and Vd, and information output to DSPin2 is voltage information between VDD and Vs. Based on the information, the digital signal processor DSP2 calculates a voltage between Vd and Vs and subsequently calculates a current value flowing to a power switch to be a measured target in the same manner as in the case shown in FIG. 1.

According to the structure, the VFC circuit to be provided in each power domain can be formed by a standard cell so that an area of the chip can be reduced. Since the information output from the VFC is a frequency, moreover, it is influenced by a noise with difficulty and a current can be measured with high precision.

Figure 12:
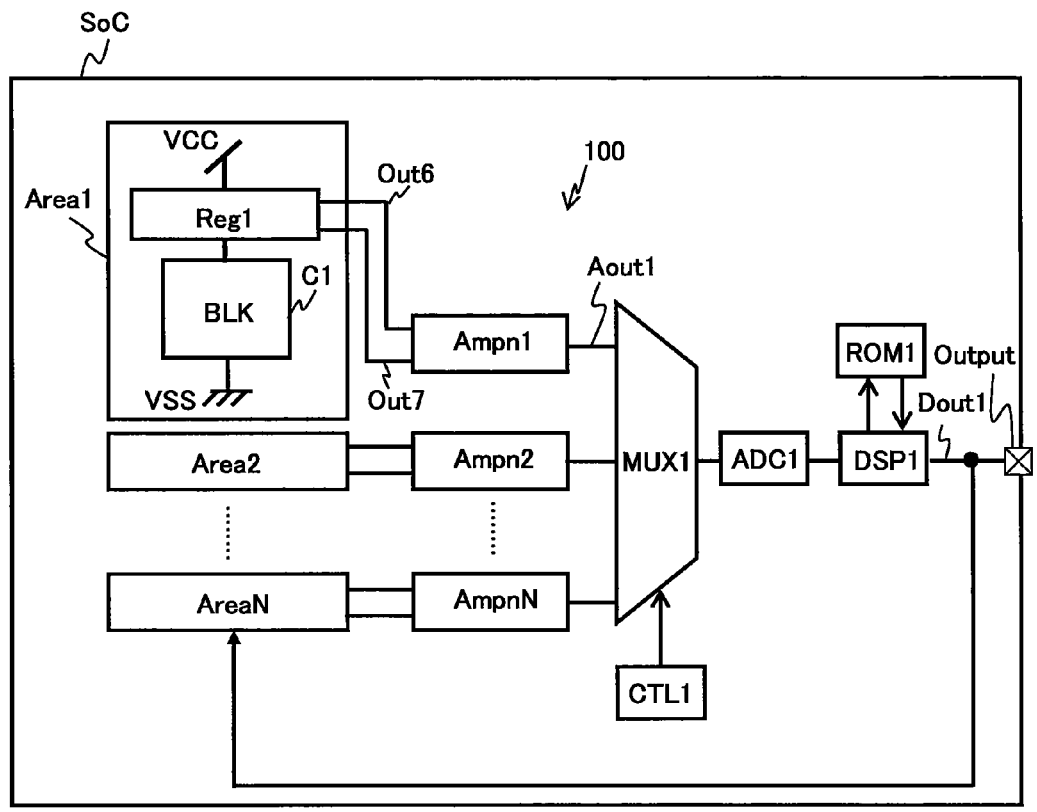
FIG. 12 is a block diagram showing a further example of the structure of the main part in the SoC.

FIG. 12 shows a further example of the structure of the main part in the SoC.

The structure shown in FIG. 12 is greatly different from that shown in FIG. 1 in that a supply of a power to a circuit block C1 in each power domain is carried out by a regulator Reg1 and a current is measured in a circuit block C1 through the regulator Reg1. In the case in which the regulator is used, a higher source voltage VCC than a high potential side source voltage VDD of a logic circuit is used.

Figure 13:
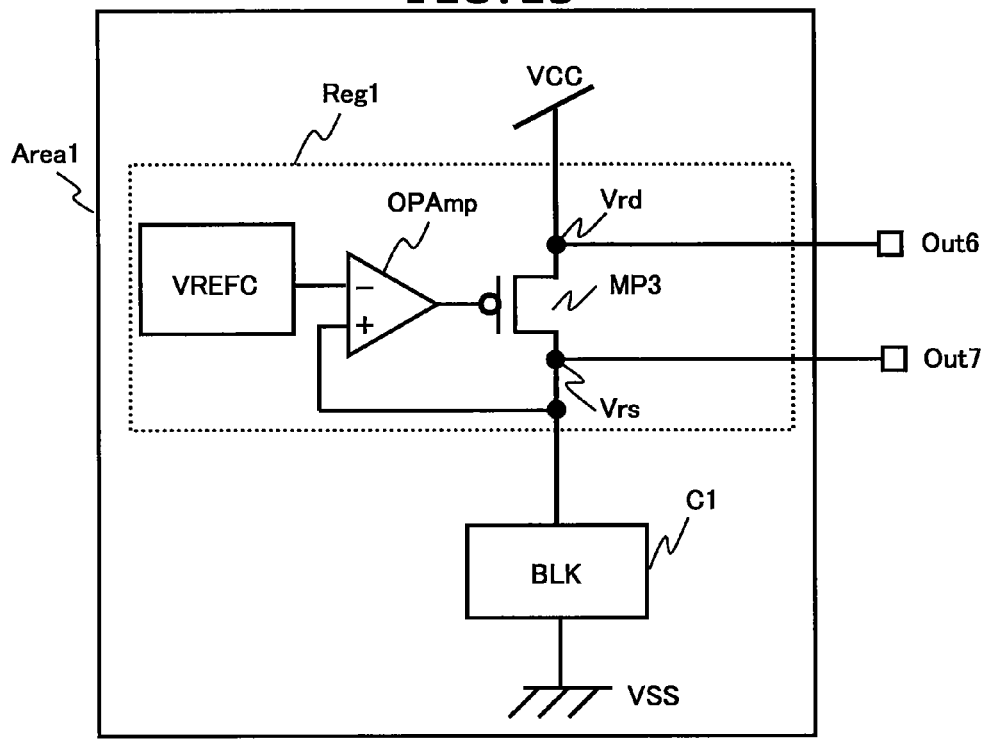
FIG. 13 is a circuit diagram showing an example of a structure of a regulator illustrated in FIG. 12.

FIG. 13 shows an example of a structure of the regulator in the power domain Area1. Regulators in the other power domains have the same structure.

The regulator Reg1 is constituted by connecting a reference voltage generating circuit VREFC, an operational amplifier OPAmp and a p-channel type MOS transistor MP3. The operational amplifier OPAmp is operated in such a manner that voltages output from a node Vrs and the reference voltage generating circuit VREFC are equal to each other. For example, when the Vrs is lower than a reference value, the operational amplifier OPAmp outputs a lower voltage than ever to return the voltage of the node Vrs to the reference value. Thus, a stable power is supplied to a circuit block C1. In the SoC, the circuit malfunctions due to a voltage drop generated in the chip in some cases in which a rapid change in the operating state of the chip is generated (when reset is carried out). On the other hand, the disadvantage can be relieved by using the regulator Reg1. Referring to a current flowing to the circuit block C1, it is sufficient that a current flowing to the p-channel type MOS transistor MP3 is measured. In the same manner as in the case of the power switch shown in FIG. 1, a drain side node voltage (Vrd) and a source side node voltage (Vrs) of the p-channel type MOS transistor MP3 are output to Out6 and Out7, respectively. The outputs are transmitted to amplifiers Ampn1 to AmpnN and are converted into currents therein.

Figure 14:
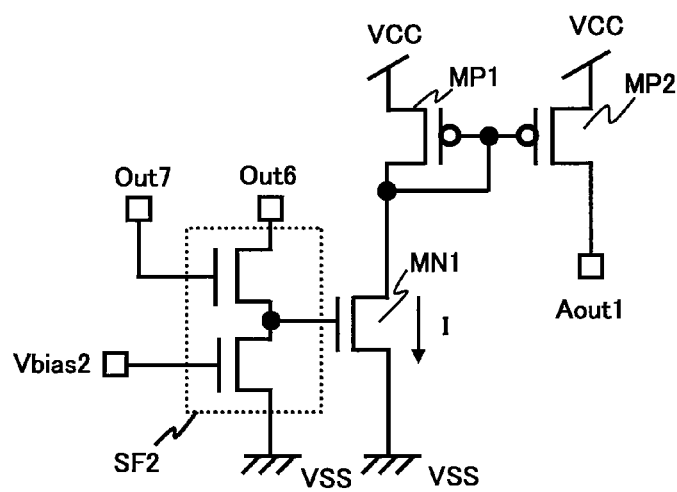
FIG. 14 is a circuit diagram showing an example of a structure of an amplifier illustrated in FIG. 12.

FIG. 14 shows an example of a structure of the amplifier Ampn1. The other amplifiers also have the same structure.

The structure shown in FIG. 14 is greatly different from that shown in FIG. 2 in respect of a structure of a source follower SF2 in an input initial stage. The signals Out6 and Out7 output from each of the power domains have values which approximate to a high voltage power supply. Therefore, circuit structures and circuit operations after the source follower SF2 in the p-channel type MOS transistor as in the SF1 shown in FIG. 2 are the same as those in FIG. 2.

A power switch PSW1 can be provided in each of the power domains. In the case in which both the regulator Reg1 and the power switch PSW1 are provided, moreover, either of them can be used for measuring the current in the circuit block C1.

Figure 16:
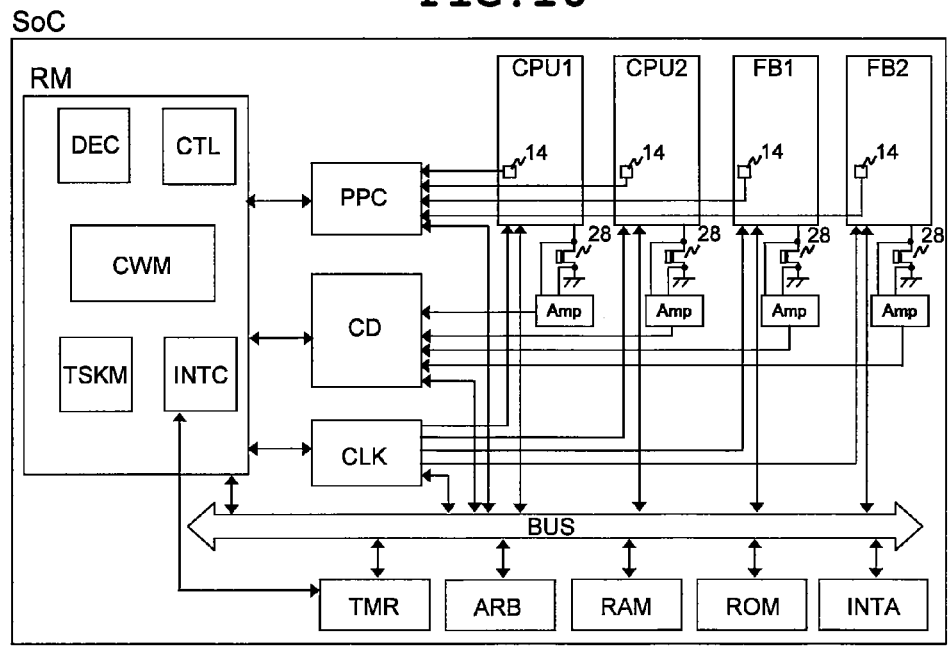
FIG. 16 is a block diagram showing an example of a structure of an internal logic circuit in an SoC according to an example of a semiconductor integrated circuit in accordance with a second embodiment of the invention.

FIG. 16 shows a main part of a semiconductor integrated circuit according to a second example of the invention. In the example, there will be described a mechanism for triggering a current value measured in a chip to carry out a feedback to a chip control. The feedback is intended for controlling a temperature of the chip, that is, a maximum current of the chip to have a certain value or less, for example. In the semiconductor integrated circuit, a rise in the temperature to have the certain value or more increases a probability that a function might be broken. In some cases, moreover, an amount of heat generated in the chip is restricted depending on a heat radiating characteristic of a package or an environment for use. For this reason, it is very important to execute the temperature control of the chip. Description will be given to a mechanism for measuring the current in the chip, thereby controlling the maximum current of the chip to have the certain value or less.

A system on a chip SoC is constituted by a resource manager RM, a CPU1, a CPU2, function blocks FB1 and FB2, a timer TMR, an RAM, an ROM, a bus arbiter ARB, an interruption controller INTA, a performance detecting circuit 14, a performance counter PPC, a clock frequency control portion CLK, an internal bus BUS, a power switch 28, an amplifier Amp, and a current measuring circuit CD. The resource manager RM is constituted by an instruction decoder DEC, a control portion CTL, a current managing portion CWM, a task managing portion TSKM and an interruption controller INTC. For instance, the current measuring circuit CD is a circuit including the multiplexer MUX1, the controller CTL1, the analog-digital converter ADC1, the read only memory ROM1 and the digital signal processor DSP1 which are shown in FIG. 1 of the example. In the example, the CPU1, the CPU2, the FB1 and the FB2 are provided in individual power domains, respectively.

Figure 17:
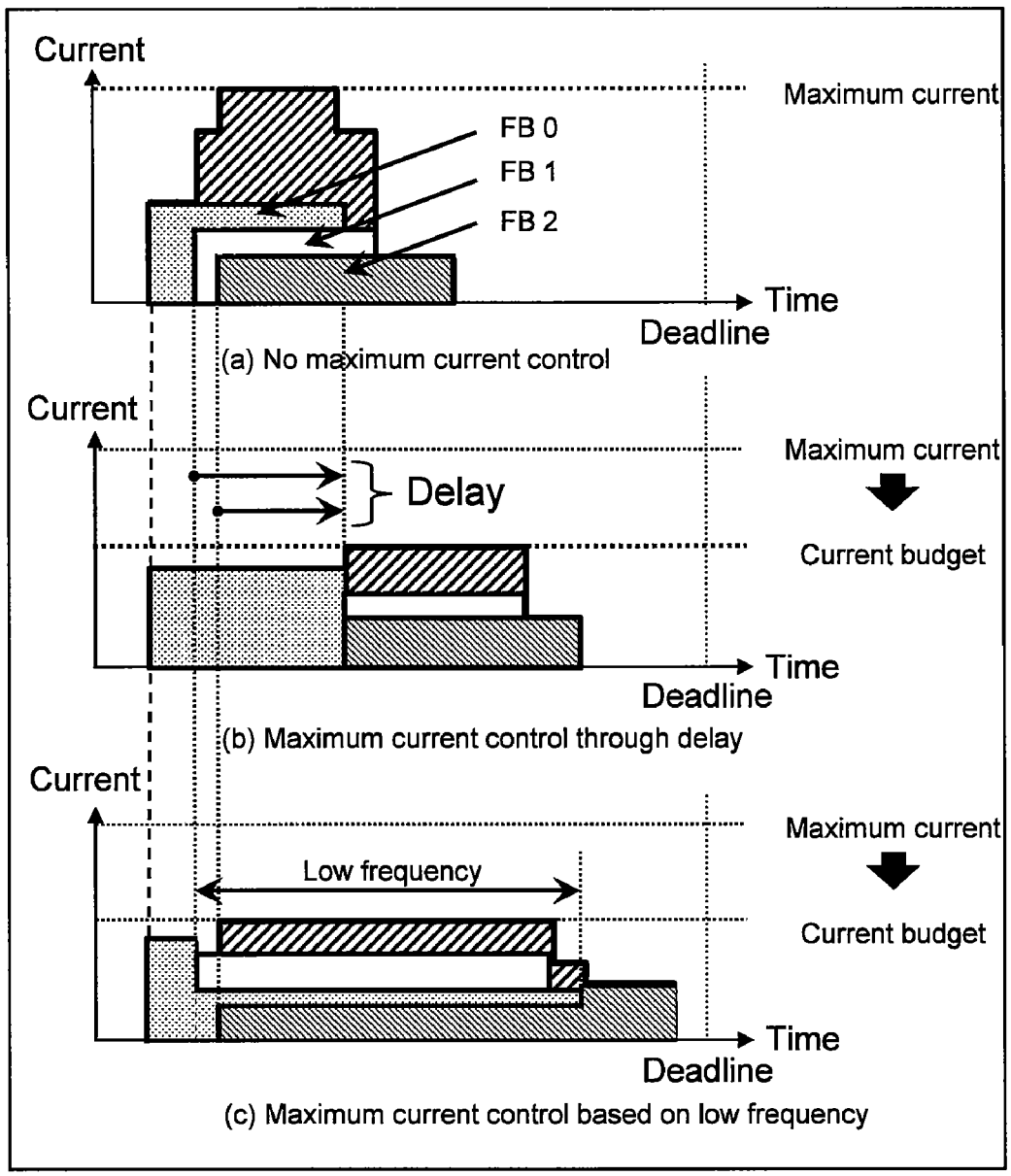
FIG. 17 is a conceptual diagram showing a maximum power control according to the second embodiment of the invention.

FIG. 17 shows a concept of a maximum current control according to a second example of the invention. An axis of abscissas indicates a time and an axis of ordinates indicates a current value. Function blocks FB0, FB1 and FB2 are shown in rectangles formed by processing times and currents, respectively. Each of processings has a time limit (a deadline). For simplicity, an equal time is set. The current value is expressed in a total value of the function blocks in a certain time. A chip current is expressed in a total area of the rectangles. (a) shows the case in which a maximum current management is not carried out, and the function blocks FB0, FB1 and FB2 execute the processings at the same time so that the maximum current value is a total value of the respective currents and is great. (b) shows the case in which a maximum current control is carried out by a delay, and the start of the execution of the function blocks FB1 and FB2 is delayed so that they do not execute the processings simultaneously with the function block FB0. Therefore, the maximum current value can be reduced. This is implemented by controlling the start of the execution in order to be adapted to a current budget and the deadline which are determined. (c) shows the case in which a frequency is controlled to carry out the maximum current control, and all of the function blocks FB0, FB1 and FB2 are operated at low clock frequencies so as to be adapted to the current budget and the deadline, thereby reducing the maximum current value. Referring to (b) and (c), if the current budget is further reduced, the deadline is not satisfied. Therefore, the control is carried out to satisfy both the current budget and the deadline. The processing of satisfying the deadline is regarded as a real-time processing because the processing is completed before a demanded time.

Figure 18:
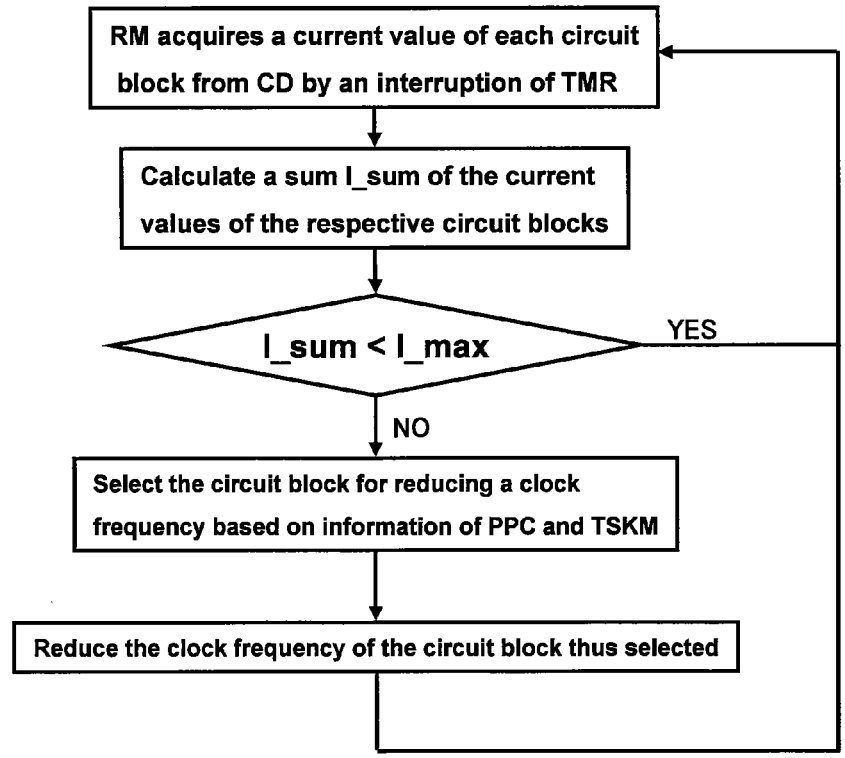
FIG. 18 is a flowchart showing a procedure for a feedback in the SoC of FIG. 16.

FIG. 18 is a flowchart showing the case in which a clock frequency is reduced to control the maximum current of the chip to have a certain value or less. The details of the flowchart will be described below. The TMR gives a notice of an interruption to INTC of the resource manager RM at a periodic time interval such as several ms. The resource manager RM receiving the notice of the interruption acquires, from the CD, a current value flowing to each of the circuit blocks CPU1, CPU2, FB1 and FB2. At the same time, TSKM in the resource manager RM updates information about tasks of the CPU and the function blocks and grasps any of the tasks which is being executed by any functional unit. Moreover, a degree of progress of the task in each of the circuit blocks is acquired from the performance counter PPC. Next, the resource manager RM calculates a total sum I_sum of the current values flowing to the circuit blocks. At this time, a maximum current value I_max permitted by the chip is preset to a current managing portion CWM. A value which is equal to or smaller than the maximum current value permitted in the chip is set to the I_max. If the I_sum is smaller than the I_max, an interruption from the TMR is waited again. If the I_sum is greater than the I_max, there is selected at least one circuit block which is executing a task having a margin of the degree of progress of the task and a low priority level based on the degree of progress of the task in each of the circuit blocks which is obtained by the PPC and the task information managed by the TSKM. The resource manager RM sends a signal for reducing the clock frequency of the selected circuit block to the clock frequency control portion CLK. Then, the clock frequency control portion CLK reduces the clock frequency to be supplied to the selected circuit block. As a result, the current value flowing to the chip is reduced so that a rise in the temperature of the chip can be controlled and the reliability of the semiconductor integrated circuit can be enhanced. If the I_sum is smaller than I_max, the clock frequency is increased so that the processing of the task can also be ended in a short time.

While the invention made by the inventor has been specifically described above, the invention is not restricted thereto but it is apparent that various changes can be made without departing from the scope thereof.

Although the description has been given to the case in which the invention made by the inventor is mainly applied to the SoC to be an applicability which is a background thereof, the invention is not restricted thereto but can be widely applied to various semiconductor integrated circuits.

What is claimed is:

1. A method of on-chip current measurement in a semiconductor integrated circuit including a circuit block having a predetermined function, and a power switch that supplies an operating power to the circuit block, the method comprising:
   obtaining a voltage between terminals of the power switch in a state in which the power switch is turned on; and
   calculating a current flowing to the circuit block based on the obtained voltage between terminals of the power switch in the turned on state and an on-resistance of the power switch.

2. The method of on-chip current measurement according to claim 1, wherein a result of the calculation of the current is output to outside the semiconductor integrated circuit through an external terminal of the semiconductor integrated circuit so that the result of the calculation of the current can be monitored externally.

3. The method of on-chip current measurement according to claim 1,
   wherein the semiconductor integrated circuit further includes a current calculating circuit, and
   wherein the current flowing to the circuit block is calculated by the current calculating circuit.

4. A semiconductor integrated circuit comprising:
   a circuit block having a predetermined function;
   a power switch that supplies an operating power to the circuit block; and
   a current measuring circuit that obtains a current flowing to the circuit block based on a voltage between terminals of the power switch in a state in which the power switch is turned on and an on-resistance of the power switch.

5. The semiconductor integrated circuit according to claim 4, wherein the current measuring circuit includes:
   an amplifier that converts the voltage between terminals of the power switch in the state in which the power switch is turned on into a corresponding current;
   an AD converter that converts a signal output from the amplifier into a digital signal; and
   a calculating circuit that calculates the current flowing to the circuit block based on the converted output of the AD converter.

6. The semiconductor integrated circuit according to claim 5, wherein the circuit block and the power switch are provided in plural sets, with each said set being associated with a corresponding amplifier.

7. The semiconductor integrated circuit according to claim 6, wherein the current measuring circuit includes a multiplexer that selectively outputs signals received from the amplifiers to the AD converter.

8. The semiconductor integrated circuit according to claim 6, wherein the current measuring circuit includes a controller configured to selectively output signals sent from the amplifiers to the AD converter by controlling the amplifiers.

9. The semiconductor integrated circuit according to claim 4, wherein the current measuring circuit includes:
   a voltage and frequency converting circuit that converts the voltage between terminals of the power switch in the state in which the power switch is turned on into a corresponding oscillating frequency;
   a frequency and voltage converting circuit that converts a signal output from the voltage and frequency converting circuit into a corresponding voltage; and
   a calculating circuit that calculates the current flowing to the circuit block based on the converted output of the frequency and voltage converting circuit.

10. The semiconductor integrated circuit according to claim 9, wherein the circuit block and the power switch are provided in plural sets, with each said set being associated with a corresponding voltage and frequency converting circuit.

11. The semiconductor integrated circuit according to claim 4, further comprising a resource manager that controls an operating clock frequency of the circuit block, the resource manager being configured to determine the operating clock frequency based on a result of a measurement of the current measuring circuit and a preset maximum current value.

* * * * *